(12) United States Patent
Watanabe (10) Patent No.: US 9,882,010 B2
(45) Date of Patent: Jan. 30, 2018

(54) SILICON CARBIDE SUBSTRATE AND METHOD FOR PRODUCING SILICON CARBIDE SUBSTRATE

(71) Applicant: SEIKO EPSON CORPORATION, Tokyo (JP)

(72) Inventor: Yukimune Watanabe, Hokuto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/153,319

(22) Filed: May 12, 2016

(65) Prior Publication Data

US 2016/0343570 A1    Nov. 24, 2016

(30) Foreign Application Priority Data

May 19, 2015    (JP) .................................. 2015-102026

(51) Int. Cl.
| | |
|---|---|
| *H01L 29/15* | (2006.01) |
| *H01L 29/32* | (2006.01) |
| *H01L 21/02* | (2006.01) |
| *H01L 29/16* | (2006.01) |

(52) U.S. Cl.
CPC ........ *H01L 29/32* (2013.01); *H01L 21/02236* (2013.01); *H01L 21/02381* (2013.01); *H01L 21/02447* (2013.01); *H01L 21/02488* (2013.01); *H01L 21/02502* (2013.01); *H01L 21/02529* (2013.01); *H01L 21/02658* (2013.01); *H01L 29/1608* (2013.01)

(58) Field of Classification Search
CPC ..................................................... H01L 29/32
USPC ............................................................ 257/77
See application file for complete search history.

(56) References Cited

U.S. PATENT DOCUMENTS

| | | | |
|---|---|---|---|
| 6,214,107 B1* | 4/2001 | Kitabatake | C30B 33/00 117/95 |
| 6,273,950 B1* | 8/2001 | Kitabatake | C30B 33/00 117/95 |
| 6,682,627 B2* | 1/2004 | Shamouilian | C04B 41/009 118/715 |
| 2005/0196974 A1* | 9/2005 | Weigel | H01L 21/02126 438/780 |
| 2006/0157733 A1* | 7/2006 | Lucovsky | H01L 21/28194 257/192 |

(Continued)

FOREIGN PATENT DOCUMENTS

JP    2015-078093 A    4/2015

OTHER PUBLICATIONS

Nagasawa et al, "Suppression of etch pit and hillock formation on carbonization of Si substrate and low temperature growth of SiC," Journal of Crystal Growth, pp. 612-616, 1991.

*Primary Examiner* — Jami M Valentine
(74) *Attorney, Agent, or Firm* — Oliff PLC (57) ABSTRACT

A silicon carbide substrate includes a Si substrate (silicon substrate), a SiC base film (silicon carbide base film) which is stacked on the Si substrate and contains silicon carbide, a defective part (through-hole) which passes through the SiC base film, a hole which is located between the Si substrate and the SiC base film corresponding to the defective part, and an oxide film which is provided on the surface of the Si substrate in the hole and contains silicon oxide. Further, on the SiC base film, a SiC grown layer (silicon carbide grown layer) may be formed.

11 Claims, 3 Drawing Sheets

(56) References Cited

U.S. PATENT DOCUMENTS

| | | | | |
|---|---|---|---|---|
| 2013/0181230 A1* | 7/2013 | Watanabe | ......... | H01L 21/02378 |
| | | | | 257/77 |
| 2015/0108504 A1* | 4/2015 | Watanabe | ......... | H01L 21/02447 |
| | | | | 257/77 |
| 2016/0126320 A1* | 5/2016 | Watanabe | ........... | H01L 29/1608 |
| | | | | 257/77 |
| 2016/0126321 A1* | 5/2016 | Watanabe | ........... | H01L 29/1608 |
| | | | | 257/77 |
| 2016/0343570 A1* | 11/2016 | Watanabe | ......... | H01L 21/02381 |

* cited by examiner

SILICON CARBIDE SUBSTRATE AND METHOD FOR PRODUCING SILICON CARBIDE SUBSTRATE

This application claims a priority to Japanese Patent Application No. 2015-102026 filed on May 19, 2015 which is hereby expressly incorporated by reference in its entirety.

BACKGROUND

1. Technical Field

Several aspects the present invention relate to a silicon carbide substrate and a method for producing a silicon carbide substrate.

2. Related Art

Silicon carbide (SiC) is a wide band gap semiconductor having a band gap (2.36 to 3.23 eV) two or more times wider than that of Si, and has attracted attention as a material for a high-withstand voltage device.

However, since the crystallization temperature of SiC is high unlike Si, it is difficult to form a single crystal ingot by the same pulling method from a liquid phase as used for forming a Si substrate. Therefore, a method in which a single crystal ingot of SiC is formed by a sublimation method has been proposed. However, it is very difficult to form a substrate having a large diameter and few crystal defects by a sublimation method. On the other hand, among SiC crystals, cubic SiC (3C-SiC) can be formed at a relatively low temperature, and therefore, a method of performing epitaxial growth on a substrate has been proposed.

As one method for producing a SiC substrate using this epitaxial growth, a heteroepitaxial technique in which 3C-SiC is grown on a Si substrate in a gas phase has been studied. In the heteroepitaxial technique in which 3C-SiC is grown, a Si substrate is sometimes exposed to a high temperature of 1000° C. or higher. However, in such a heating process, Si atoms are sublimated from the Si substrate to cause a problem that the flatness of the Si substrate is deteriorated or the growth of 3C-SiC is inhibited.

In view of this, a method in which the sublimation of Si atoms is suppressed by carbonizing the surface of the Si substrate to form a SiC film (carbide film) has been studied. However, in the case where a defective part (pinhole) is present in the SiC film, Si atoms are sublimated from the Si substrate through this defective part. As a result, when 3C-SiC is grown on the SiC film by the heteroepitaxial technique, deterioration of the crystallinity of 3C-SiC is caused.

With respect to such a problem, NPL 1 (Journal of Crystal Growth 115 (1991) 612-616) describes that by increasing the pressure of a treatment gas (acetylene) to be used in the carbonization treatment, the defective part can be closed.

However, as a result of a detailed study made by the present inventors, it was found that the defective part once closed in the carbonization treatment reopens in the subsequent process. If the defective part opens in this manner, when 3C-SiC is grown on the SiC film, deterioration of the crystallinity of 3C-SiC is caused due to the effect of the defective part.

SUMMARY

An advantage of some aspects of the invention is to provide a high-quality silicon carbide substrate and a method for producing a silicon carbide substrate capable of efficiently producing a high-quality silicon carbide substrate.

The advantage of the invention can be achieved by the following configuration.

A silicon carbide substrate according to an aspect of the invention includes a silicon substrate, a silicon carbide base film which is stacked on the silicon substrate, a through-hole which passes through the silicon carbide base film, a hole which is located between the silicon substrate and the silicon carbide base film corresponding to the through-hole, and an oxide film which covers the surface of the silicon substrate in the hole.

According to this configuration, the sublimation of Si atoms from the inner surface of the hole is suppressed by the oxide film, and therefore, the effect of sublimated Si atoms on the growth of crystals of silicon carbide is suppressed, and thus, a silicon carbide substrate capable of growing a high-quality silicon carbide single crystal is obtained.

In the silicon carbide substrate according to the aspect of the invention, it is preferred that the thickness of the silicon carbide base film is 2 nm or more and 100 nm or less.

According to this configuration, the sublimation of Si atoms from the silicon substrate in the epitaxial growth is sufficiently suppressed, and also, the flatness of the surface of the silicon carbide base film is less likely to be deteriorated. As a result, a silicon carbide substrate capable of growing a high-quality silicon carbide single crystal is obtained.

In the silicon carbide substrate according to the aspect of the invention, it is preferred that the thickness of the oxide film is 3 nm or more and 300 nm or less.

According to this configuration, even if the substrate is subjected to a thermal history such as epitaxial growth, the sublimation of Si atoms can be sufficiently suppressed, and also the oxide film can be prevented from becoming too thick and interfering with the silicon carbide base film.

In the silicon carbide substrate according to the aspect of the invention, it is preferred that the silicon carbide substrate further includes a silicon carbide grown layer on the silicon carbide base film.

According to this configuration, a silicon carbide substrate having a high-quality silicon carbide grown layer is obtained.

A method for producing a silicon carbide substrate according to an aspect of the invention includes a first step of forming a first silicon carbide substrate by forming a silicon carbide base film on one surface side of a silicon substrate, and a second step of forming a second silicon carbide substrate by subjecting the first silicon carbide substrate to an oxidation treatment, wherein the second silicon carbide substrate is a substrate in which an oxide film is formed in a hole between the silicon substrate and the silicon carbide base film in the first silicon carbide substrate.

According to this configuration, a silicon carbide substrate capable of growing a high-quality silicon carbide single crystal can be efficiently produced.

In the method for producing a silicon carbide substrate according to the aspect of the invention, it is preferred that the oxidation treatment is a treatment in which the first silicon carbide substrate is heated in an oxygen-based gas atmosphere.

According to this configuration, silicon oxide is formed by reacting Si atoms with oxygen on the inner surface of the hole, and therefore, an oxide film can be efficiently formed.

In the method for producing a silicon carbide substrate according to the aspect of the invention, it is preferred that the method further includes a third step of forming a third silicon carbide substrate by subjecting the second silicon carbide substrate to an etching treatment using a solution containing hydrofluoric acid.

According to this configuration, a clean surface of the silicon carbide base film is exposed, and thus, the quality of a silicon carbide single crystal grown thereon can be further increased.

In the method for producing a silicon carbide substrate according to the aspect of the invention, it is preferred that the first step includes a step of heating the silicon substrate in a carbon-based gas atmosphere.

According to this configuration, the silicon carbide base film is formed by converting part of the silicon substrate to silicon carbide, and therefore, a silicon carbide base film which has high crystallinity and favorable surface flatness can be formed.

In the method for producing a silicon carbide substrate according to the aspect of the invention, it is preferred that the temperature of the first silicon carbide substrate is maintained at normal temperature or higher when transition is made from the first step to the second step.

According to this configuration, the base film formation step and the oxidation step can be simplified and the time required for the steps can be reduced. In addition, these two steps can be performed in succession, and therefore, the first silicon carbide substrate can be protected from contamination or thermal shock.

In the method for producing a silicon carbide substrate according to the aspect of the invention, it is preferred that the method further includes a fourth step of epitaxially growing silicon carbide on the third silicon carbide substrate.

According to this configuration, a silicon carbide substrate having a high-quality silicon carbide single crystal can be efficiently produced.

In the method for producing a silicon carbide substrate according to the aspect of the invention, it is preferred that the heating temperature in the second step is lower than the heating temperature in the first step.

According to this configuration, the hole located between the silicon substrate and the silicon carbide base film is prevented from being enlarged in the oxidation treatment. As a result, the amount of Si atoms sublimated from the inner surface of the hole can be suppressed to small.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a silicon carbide substrate and a method for producing a silicon carbide substrate will be described in detail based on preferred embodiments shown in the accompanying drawings. Incidentally, in the following description, for the sake of convenience of explanation, the upper side in FIG. 1 is referred to as "upper" and the lower side in FIG. 1 is referred to as "lower".

First Embodiment

In this embodiment, a silicon carbide substrate in which an oxide film is formed in a hole between a silicon substrate and a silicon carbide base film stacked on the silicon substrate is described.

Figure 1:
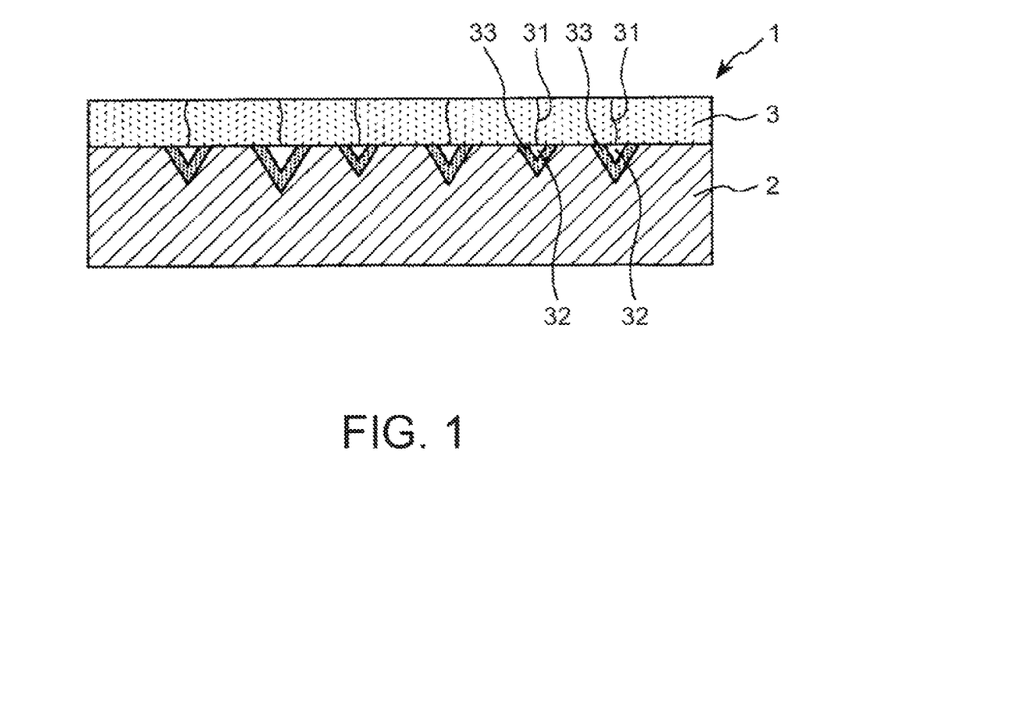
FIG. 1 is a longitudinal cross-sectional view showing an embodiment of a silicon carbide substrate according to the invention.

FIG. 1 is a longitudinal cross-sectional view of a silicon carbide substrate 1 according to this embodiment.

The silicon carbide substrate 1 includes a Si substrate (silicon substrate) 2 and a SiC base film (silicon carbide base film) 3 which is stacked on the Si substrate 2. Such a silicon carbide substrate 1 is used as a base for epitaxially growing cubic silicon carbide by using the SiC base film 3 as a seed layer.

The Si substrate 2 is obtained by, for example, slicing a silicon single crystal ingot pulled by a CZ method (Czochralski method), followed by polishing. This Si substrate 2 may be a substrate having any orientation in the plane, however, for example, a substrate whose principal surface is the (100) plane or is an offset plane in which the crystal axis of the (100) plane is inclined by several degrees may be used.

In this embodiment, a case where the Si substrate 2 is a silicon crystal substrate is described, however, the Si substrate 2 is not limited thereto, and may be, for example, a composite substrate having a crystalline silicon film formed on a substrate made of quartz, sapphire, polycrystalline SiC, or the like.

Further, in the case where the Si substrate 2 is a silicon crystal substrate, the entirety thereof is preferably a single crystal, but may be a polycrystal.

The thickness of the Si substrate 2 is appropriately set so as to have a mechanical strength such that the Si substrate 2 can support the SiC base film 3, but is preferably, for example, about 100 μm or more and 2 mm or less.

The SiC base film 3 is stacked on the upper surface of the Si substrate 2. This SiC base film 3 may be a carbide film formed by subjecting the surface of a silicon single crystal substrate to a carbonization treatment, and may be a film obtained by depositing SiC on the surface of a silicon single crystal substrate.

The crystal structure of the SiC base film 3 is not particularly limited, but is, for example, cubic SiC (3C-SiC). However, a crystal other than 3C-SiC, for example, 4H-SiC or 6H-SiC may be adopted.

The thickness of the SiC base film 3 is not particularly limited, but is preferably 2 nm or more and 100 nm or less, more preferably 3 nm or more and 50 nm or less, further more preferably 4 nm or more and 10 nm or less. By setting the thickness of the SiC base film 3 within the above range, even if it is subjected to a thermal history such as epitaxial growth in the production steps thereafter, the sublimation of Si atoms from the Si substrate 2 can be sufficiently suppressed, and also the SiC base film 3 in which the flatness of the upper surface is less likely to be deteriorated is obtained.

That is, when the thickness of the SiC base film 3 is less than the above lower limit, the coating of the Si substrate 2 with the SiC base film 3 may be insufficient, and depending on the conditions for the epitaxial growth, significant sublimation of Si atoms occurs at the initial stage of the process of epitaxial growth, and therefore, the quality of a SiC grown layer to be grown may be deteriorated. On the other hand, when the thickness of the SiC base film 3 exceeds the above upper limit, depending on the conditions for the formation of the SiC base film 3, the flatness of the upper surface of the SiC base film 3 may be deteriorated, and therefore, the quality of a SiC grown layer to be grown thereon may be deteriorated.

The thickness of the SiC base film 3 is measured by a measurement method using, for example, an optical method such as an ellipsometric method or is determined by a method in which the cross section of the silicon carbide substrate 1 is observed using an electron microscope, a light microscope, or the like, and the thickness of the SiC base film 3 is measured in an observation image, or the like.

In addition, the entirety of the SiC base film 3 is preferably a single crystal, but is not necessarily limited thereto and may be a polycrystal.

In the SiC base film 3, for example, due to a difference between the lattice constant of silicon and the lattice constant of silicon carbide, or the like, a plurality of defective parts (through-holes) 31 occur, and holes 32 are present on the surface of the Si substrate 2 corresponding to the defective parts 31. On the surface of the Si substrate 2 in each hole 32, an oxide film 33 is formed.

By forming the oxide film 33, even if heating is performed for the silicon carbide substrate 1, sublimation of Si atoms from the surface of the hole 32 does not occur. Since sublimation of Si atoms does not occur, sublimated Si atoms do not appear on the surface of the SiC base film 3 through the defective part 31, and therefore, the adverse effect brought about by the sublimation of Si atoms on the subsequent production steps using the silicon carbide substrate 1 can be eliminated.

Second Embodiment

Figure 2:
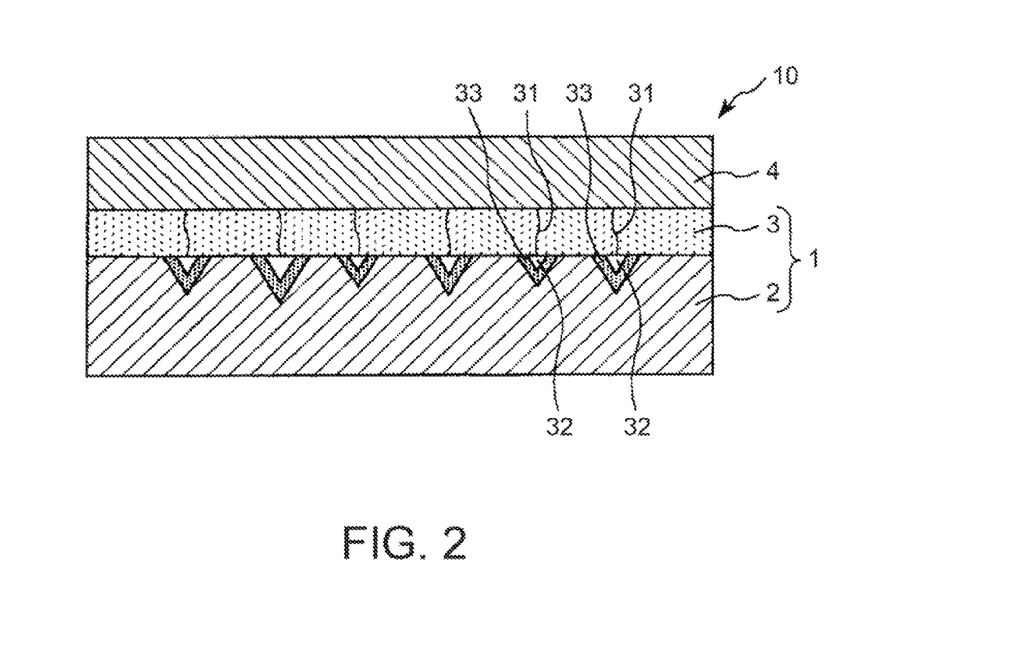
FIG. 2 is a longitudinal cross-sectional view showing one example of a silicon carbide substrate produced by an embodiment of a method for producing a silicon carbide substrate according to the invention, and is a view seen from a direction perpendicular to the (011) plane of a Si substrate.

In this embodiment, a silicon carbide substrate 10 which is obtained by further epitaxially growing cubic silicon carbide on the silicon carbide substrate 1 described in the first embodiment by using the SiC base film 3 as a seed layer is described.

FIG. 2 is a longitudinal cross-sectional view of the silicon carbide substrate 10 in this embodiment, and is a view seen from a direction perpendicular to the (011) plane of the Si substrate. The silicon carbide substrate 10 includes the silicon carbide substrate 1 and a SiC grown layer 4 stacked thereon.

The SiC grown layer 4 according to this embodiment is a semiconductor layer constituted by cubic silicon carbide (3C-SiC). The cubic silicon carbide has a wide band gap of 2.36 eV or more, and also has a high thermal conductivity and a high breakdown electric field, and therefore is preferably used as, for example, a wide band gap semiconductor for a power device.

The SiC grown layer 4 is not limited to the semiconductor layer constituted by 3C-SiC, and may be, for example, a semiconductor layer constituted by 4H-SiC or 6H-SiC.

As described in the first embodiment, in the silicon carbide substrate 1, the adverse effect brought about by the sublimation of Si atoms from the Si substrate 2 does not occur in the subsequent step of heating the substrate. That is, the growth of the SiC grown layer 4 is not inhibited. Due to this, the silicon carbide substrate 10 can include the SiC grown layer 4 with few crystal defects and high quality.

Such a silicon carbide substrate 10 is preferably used as, for example, a semiconductor substrate for a power device characterized by having a wide band gap. Examples of the power device include a transistor for a boost converter and a diode. Specific examples thereof include a metal-oxide-semiconductor field-effect transistor (MOSFET), an insulated-gate bipolar transistor (IGBT), and a Schottky barrier diode (SBD).

The SiC base film 3 of the silicon carbide substrate 1 has a function to improve the quality of a SiC layer in the first place when the SiC layer is formed on the SiC base film 3. The function is a function to reduce crystal defects caused by a difference between the lattice constant of silicon and the lattice constant of silicon carbide. However, for the same reason, also in the SiC base film 3 formed on the Si substrate 2, defective parts 31 are present. The sublimation of Si atoms from the defective parts 31 deteriorates the quality of the SiC grown layer 4. However, the silicon carbide substrate 1 can suppress the decrease in the quality caused by this problem.

The oxide film 33 contains silicon oxide. Examples of the silicon oxide include SiO and $SiO_2$.

The content of silicon oxide in the oxide film 33 is not particularly limited, but is preferably 50 mass % or more, more preferably 90 mass % or more, and it is further more preferred that the oxide film 33 is composed of substantially 100 mass % of silicon oxide formed by a heat treatment. Such an oxide film 33 can particularly suppress the sublimation of Si atoms.

The thickness of the oxide film 33 is not particularly limited, but is preferably 3 nm or more and 300 nm or less, more preferably 5 nm or more and 150 nm or less, further more preferably 7 nm or more and 30 nm or less. By setting the thickness of the oxide film 33 within the above range, for example, even if it is subjected to a thermal history such as epitaxial growth, the sublimation of Si atoms from the Si substrate 2 can be sufficiently suppressed, and also the oxide film 33 can be prevented from becoming too thick and interfering with the SiC base film 3.

That is, when the thickness of the oxide film 33 is less than the above lower limit, the thickness of the oxide film 33 is insufficient, and a discontinuous portion is likely to be formed in the oxide film 33, and therefore, the sublimation of Si atoms may not be able to be sufficiently suppressed. On the other hand, when the thickness of the oxide film 33 exceeds the above upper limit, the thickness of the oxide film 33 is too thick, and therefore, the oxide film 33 protrudes from the hole 32 and may interfere with the SiC base film 3. Further, in the case where the oxide film 33 is formed by a thermal oxidation method, when the thickness of the oxide film 33 exceeds the above upper limit, the SiC base film 3 may be oxidized.

The thickness of the oxide film 33 is determined by, for example, observing the cross section of the silicon carbide substrate 1 using an electron microscope, a light microscope, or the like, and measuring the thickness of the oxide film 33 in an observation image.

Third Embodiment

In this embodiment, a method for producing the silicon carbide substrate 1 described in the first embodiment (an embodiment of a method for producing a silicon carbide substrate according to the invention) is described.

Figure 3A:
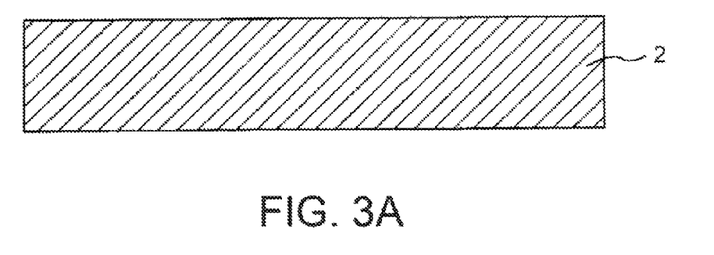
FIGS. 3A to 3C are views for illustrating a method for producing the silicon carbide substrate shown in FIG. 1.
Figure 3B:
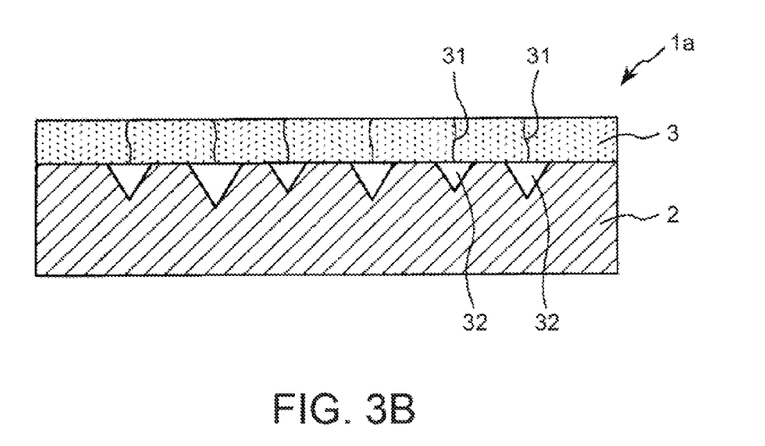
Figure 3C:
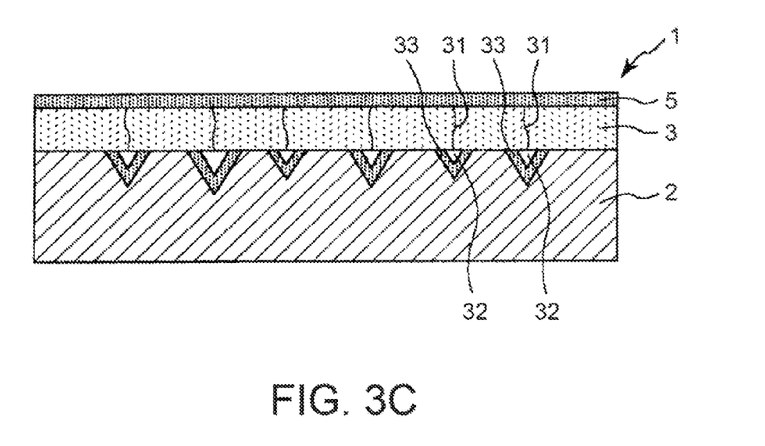

FIGS. 3A to 3C are views for illustrating a method for producing the silicon carbide substrate 1.

The method for producing the silicon carbide substrate 1 according to this embodiment includes [1] a base film formation step of forming a SiC base film 3 on the upper surface of a Si substrate 2 (first step) and [2] an oxidation step of forming an oxide film 33 between the Si substrate 2 and the SiC base film 3 by subjecting the SiC base film 3 to an oxidation treatment (second step). Hereinafter, the respective steps will be sequentially described.

[1] First, a Si substrate 2 shown in FIG. 3A is prepared. Incidentally, the Si substrate 2 may be subjected to a cleaning treatment utilizing etching or the like as needed.

Subsequently, as shown in FIG. 3B, a SiC base film 3 is formed on the upper surface of the Si substrate 2 (base film formation step).

The method for forming the SiC base film 3 is not particularly limited, and may be, for example, a method for forming a film on the Si substrate 2 by a gas phase deposition method or the like such as a CVD method or a vapor deposition method, however, a carbonization treatment in which the upper surface of the Si substrate 2 is carbonized is preferably used. According to such a carbonization treatment, part of the Si substrate 2 is converted to silicon carbide, and therefore, as compared with other methods, the SiC base film 3 having higher crystallinity can be formed.

The carbonization treatment is performed by heating the Si substrate 2 in a carbon-based gas atmosphere. The carbon-based gas atmosphere is constituted by a treatment gas containing a carbon-based gas. The carbon-based gas is not limited as long as it is a carbon-containing gas, however, examples thereof include, in addition to ethylene ($C_2H_4$), acetylene ($C_2H_2$), propane ($C_3H_8$), methane ($CH_4$), ethane ($C_2H_6$), normal butane (n-$C_4H_{10}$), isobutane (i-$C_4H_{10}$), and neopentane (neo-$C_5H_{12}$), and among these, one type or two or more types in combination can be used. Further, in the treatment gas, an arbitrary gas such as a carrier gas may be mixed as needed.

Examples of the carrier gas include hydrogen, nitrogen, helium, and argon. In the case where the carrier gas is used, the concentration of the carbon-based gas in the treatment gas is appropriately set according to the speed or the like of the carbonization treatment, but is preferably, for example, 0.1 vol % or more and 30 vol % or less, more preferably 0.3 vol % or more and 5 vol % or less.

The heating temperature of the Si substrate 2 in the carbonization treatment is preferably 500° C. or higher and 1400° C. or lower, more preferably 800° C. or higher and 1300° C. or lower, further more preferably 950° C. or higher and 1200° C. or lower. In addition, as for the heating time of the Si substrate 2 in the carbonization treatment, the time for exposing the Si substrate 2 to the heating temperature is preferably 0.5 minutes or more, more preferably 1 minute or more and 60 minutes or less, further more preferably 3 minutes or more and 30 minutes or less.

By setting the heating conditions within the above range, the SIC base film 3 having a thickness as described above can be formed. Further, by optimizing the thermal energy to be applied, the speed of conversion to silicon carbide is optimized, and therefore, the SiC base film 3 with less defective parts 31 can be formed.

Further, the carbonization treatment may be performed in any of a normal pressure atmosphere, a pressurized atmosphere, and a depressurized atmosphere, but is preferably performed in a state where the treatment gas is introduced while evacuating the inside of a treatment chamber in which the Si substrate 2 is placed. The introduction amount of the carbon-based gas in the treatment gas is, for example, 10 sccm or more and 100 sccm or less.

In this manner, a silicon carbide substrate 1*a* (first silicon carbide substrate) including the Si substrate 2 and the SiC base film 3 formed thereon is obtained.

Also with respect to the surface of the SiC base film 3, favorable flatness is obtained. However, due to a difference between the lattice constant of silicon and the lattice constant of silicon carbide, or the like, a plurality of defective parts 31 occur, and Si atoms are sublimated from the Si substrate 2 through the defective parts 31, and therefore, holes 32 are formed at positions corresponding to the positions of the plurality of defective parts 31, respectively, in the silicon carbide substrate 1*a*.

[2] Subsequently, the silicon carbide substrate 1*a* is subjected to an oxidation treatment. By doing this, an oxide film 33 is formed on the surface of the Si substrate 2 in each hole 32 (oxidation step). Accordingly, a silicon carbide substrate 1 (second silicon carbide substrate) is obtained.

The oxidation treatment may be performed by any method, however, in this embodiment, the oxidation treatment is performed by heating the silicon carbide substrate 1*a* in an oxygen-based gas atmosphere by a dry oxidation method using oxygen gas or a wet oxidation method using water vapor. By doing this, oxygen is supplied to the hole 32 through the defective part 31. As a result, silicon oxide is efficiently formed by reacting Si atoms with oxygen on the inner surface of the hole 32. This silicon oxide is formed so as to cover the inner surface of the hole 32, and therefore, the oxide film 33 which functions as a cover of the inner surface of the hole 32 is obtained in this manner (see FIG. 3C).

The place where the oxide film 33 is formed is not limited to the inner surface of the hole 32, and for example, the oxide film 33 is formed also on part of the interface between the Si substrate 2 and the SiC base film 3 in some cases. In addition, also on the upper surface of the SiC base film 3, an oxide coating film 5 which is thinner than the oxide film 33 is formed. A difference in the thickness between the oxide film 33 and the oxide coating film 5 occurs due to a difference in the oxidation speed between Si and SiC. Although it varies depending on the conditions such as the oxidation treatment temperature, the thickness of the oxide coating film 5 is ⅓ to ⅕ the thickness of the oxide film 33.

The oxygen-based gas atmosphere is constituted by a treatment gas containing an oxygen-based gas. The oxygen-based gas is not particularly limited as long as it is an oxygen-containing gas, however, examples thereof include oxygen and ozone, and among these, one type or two or more types in combination can be used.

The heating temperature of the silicon carbide substrate 1*a* in the oxidation treatment is preferably lower than the heating temperature of the Si substrate 2 in the carbonization treatment. According to this, the hole 32 can be prevented from being further enlarged. This oxidation treatment is a treatment in which the oxide film 33 is formed on the surface of the hole 32, however, the hole 32 may also be enlarged in parallel during the period until the formation is completed. Due to this, by setting the heating temperature in the oxidation treatment to lower than the heating temperature in the carbonization treatment, the amount of Si atoms sublimated from the inner surface of the hole 32 can be suppressed to small. As a result, the enlargement of the hole 32 can be suppressed.

The heating temperature in the oxidation treatment is lower than the heating temperature in the carbonization treatment preferably by 10° C. or more and 300° C. or less, more preferably by 20° C. or more and 250° C. or less.

On the other hand, the heating temperature in the oxidation treatment may be equal to or higher than a temperature capable of oxidizing Si, but is more preferably 1200° C. or lower, further more preferably 1100° C. or lower. In addition, as for the heating time of the silicon carbide substrate 1a in the oxidation treatment, the time for exposing the silicon carbide substrate 1a to the heating temperature is preferably 0.5 minutes or more, more preferably 1 minute or more and 300 minutes or less, further more preferably 5 minutes or more and 120 minutes or less.

By setting the heating conditions within the above range, while minimizing the enlargement of the hole 32, the oxide film 33 having a thickness as described above can be formed. Further, by optimizing the thermal energy to be applied, the speed of conversion to silicon oxide is optimized, and therefore, the defective parts occurring in the oxide film 33 can be minimized. That is, the defective parts can be prevented from occurring in the oxide film 33, and thus, the sublimation of Si through the defective parts can be prevented from occurring.

Further, the oxidation treatment may be performed in any of a normal pressure atmosphere, a pressurized atmosphere, and a depressurized atmosphere, but is preferably performed in a state where the treatment gas is introduced while evacuating the inside of a treatment chamber in which the silicon carbide substrate 1a is placed.

Some defective parts 31 may be closed while forming the SiC base film 3. However, the defective parts 31 closed in this manner can be reopened by heating under the heating conditions as described above. In this manner, by supplying oxygen through the opened defective parts 31, the oxide film 33 can be formed at the interface between the Si substrate 2 and the SiC base film 3.

The oxidation reaction may occur also on the surface of the SiC base film 3 (on the upper surface of the SiC base film 3 or the inner surface of the defective part 31, etc.) in some cases. In such a case, as shown in FIG. 3C, also on the surface of the SiC base film 3, the oxide coating film 5 is formed. The oxidation speed of SiC is lower than the oxidation speed of Si, and therefore, the thickness of the oxide coating film 5 is thinner than the thickness of the oxide film 33.

In the case where such an oxide coating film 5 is formed, a treatment of removing the oxide coating film 5 may be performed as needed.

The treatment of removing the oxide coating film 5 is not particularly limited, and may be a physical removal method, but is preferably a chemical removal method such as an etching treatment using a treatment liquid capable of etching the oxide coating film 5 (third step). For example, an aqueous solution containing hydrofluoric acid (hereinafter also referred to as "treatment liquid") may be allowed to act on the oxide coating film 5. By doing this, the oxide coating film 5 is dissolved and removed. As a result, a clean upper surface of the SiC base film 3 is exposed. Incidentally, the oxide coating film 5 is formed also on the defective part 31, and therefore, the etching treatment may be performed for a sufficient time for removing the oxide coating film 5, and the oxide film 33 is not completely removed by this treatment.

The concentration of hydrofluoric acid in the treatment liquid is preferably, for example, about 0.1 mass % or more and 50 mass % or less. Further, after the etching treatment, washing with pure water or the like may be performed as needed.

In this manner, a silicon carbide substrate 1 (third silicon carbide substrate) including the Si substrate 2, the SiC base film 3, and the oxide film 33 is obtained.

The silicon carbide substrate 1 formed in this manner can suppress the sublimation of Si atoms from the hole 32 thereafter by the oxide film 33 which covers the inner surface of the hole 32. Due to this, even if the defective parts 31 are included in the SiC base film 3, the adverse effect of the sublimation of Si atoms on the subsequent treatments using the silicon carbide substrate 1 can be minimized. Therefore, for example, in the case where a SiC layer is further grown on the silicon carbide substrate 1, a high-quality SiC layer can be obtained.

It is preferred that after completion of the base film formation step, the oxidation step is performed while maintaining the temperature of the silicon carbide substrate 1a at normal temperature or higher (preferably, without decreasing the temperature to normal temperature). By doing this, the two steps can be performed in succession, and therefore, the production process can be simplified and the time required for the process can be reduced.

Further, since this step can be performed in succession only by changing the atmosphere in the treatment chamber after performing the carbonization treatment (after performing the base film formation step) in the treatment chamber, the silicon carbide substrate 1a is less likely to come in contact with the outside air, and therefore, the silicon carbide substrate 1a can be protected from contamination or thermal shock.

The normal temperature refers to a temperature in an environment in which the treatment chamber is placed, and is generally 5° C. or higher and 35° C. or lower.

Further, in the case where the treatment gas is introduced in the base film formation step, the type of the treatment gas may be changed when transition is made to the oxidation step. By doing this, the transition from the base film formation step to the oxidation step can be very easily made.

The Si substrate 2 is preferably configured such that the crystal plane constituting the inner surface of the hole 32 is the (111) plane of Si. According to this, the inner surface of the hole 32 becomes a plane on which the oxidation reaction proceeds fast when it is subjected to the oxidation treatment. Due to this, the oxide film 33 having a sufficient thickness can be formed by the oxidation treatment in a short time, and therefore, the thickness of the oxide coating film 5 formed on the upper surface of the SiC base film 3 can be minimized. As a result, the time required for the etching treatment can be reduced.

Fourth Embodiment

Figure 4A:
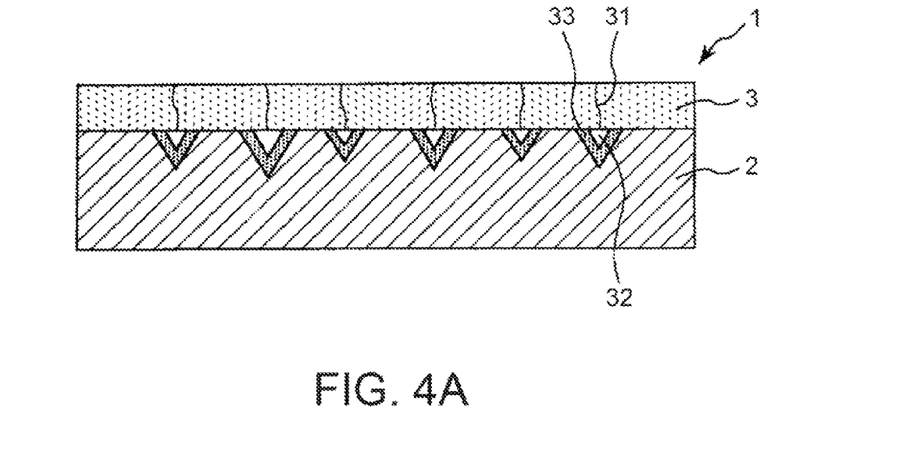
FIGS. 4A and 4B are views for illustrating a method for producing the silicon carbide substrate shown in FIG. 2.
Figure 4B:
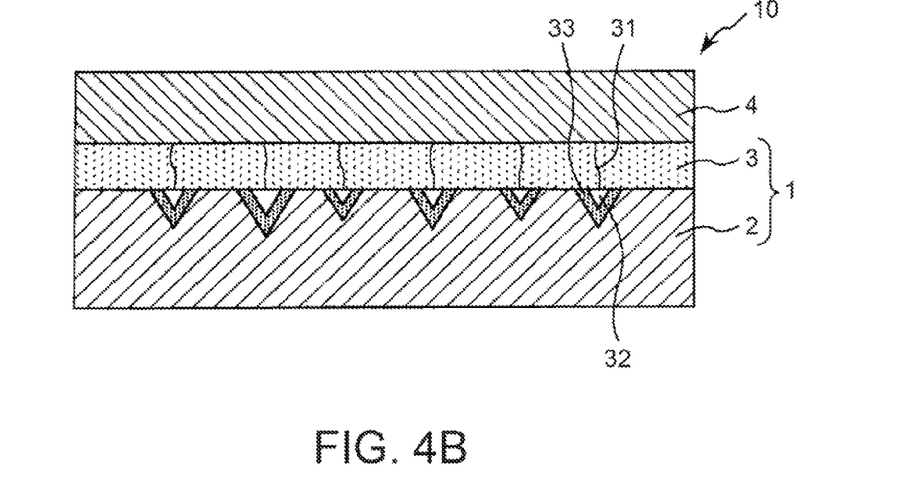

In this embodiment, a method for producing the silicon carbide substrate 10 described in the second embodiment is described. FIGS. 4A and 4B are views for illustrating a method for producing the silicon carbide substrate 10.

The silicon carbide substrate 10 is produced by further performing a crystal growth step of epitaxially growing a SiC grown layer 4 on a SiC base film 3 (fourth step) after the step of producing the silicon carbide substrate 1 described in the third embodiment. The SiC base film 3 functions as a seed layer for epitaxially growing the SiC grown layer 4.

First, a silicon carbide substrate 1 from which an oxide coating film 5 has been removed is prepared. The silicon carbide substrate 1 is shown in FIG. 4A.

In the silicon carbide substrate 1 shown in FIG. 4A, while silicon carbide is exposed on the upper surface thereof (the upper surface of the SiC base film 3), an oxide film 33 is formed on the inner surface of a hole 32, and therefore, the sublimation of Si atoms in the subsequent step of performing heating is suppressed. Due to this, the effect of a defective part 31 gradually disappears as the SiC grown layer 4 is grown, and a high-quality SiC grown layer 4 can be efficiently grown thereby.

The SiC grown layer 4 is formed by, for example, placing the silicon carbide substrate 1 in a treatment chamber, and heating the silicon carbide substrate 1 while introducing a raw material gas, thereby depositing cubic silicon carbide on the SiC base film 3. The state where the SiC grown layer 4 is formed is shown in FIG. 4B.

Examples of the raw material gas include a mixed gas in which a carbon-containing gas and a silicon-containing gas are mixed at a predetermined ratio, a carbon and silicon-containing gas in which carbon and silicon are contained at a predetermined ratio, and a mixed gas of multiple types of gases in which a carbon-containing gas, a silicon-containing gas, and a carbon and silicon-containing gas are mixed at a predetermined ratio.

Among these, examples of the carbon-containing gas include, in addition to ethylene ($C_2H_4$), acetylene ($C_2H_2$), propane ($C_3H_8$), methane ($CH_4$), ethane ($C_2H_6$), normal butane (n-$C_4H_{10}$), isobutane (i-$C_4H_{10}$), and neopentane (neo-$C_5H_{12}$), and among these, one type or two or more types in combination can be used.

Examples of the silicon-containing gas include monosilane ($SiH_4$), disilane ($Si_2H_6$), trisilane ($Si_3H_8$), tetrasilane ($Si_4H_{10}$), dichlorosilane ($SiH_2Cl_2$), tetrachlorosilane ($SiCl_4$), trichlorosilane ($SiHCl_3$), and hexachlorodisilane ($Si_2Cl_6$), and among these, one type or two or more types in combination can be used.

Examples of the carbon and silicon-containing gas include methylsilane ($SiH_3CH_3$), dimethylsilane ($SiH_2(CH_3)_2$), and trimethylsilan ($SiH(CH_3)_3$), and among these, one type or two or more types in combination can be used.

The composition of the raw material gas is appropriately set according to the composition of cubic silicon carbide. By doing this, the SiC grown layer 4 composed of cubic silicon carbide having a stoichiometric composition can be grown.

The heating temperature for the epitaxial growth, that is, the temperature of the Si substrate 2 during the epitaxial growth is preferably 600° C. or higher and 1400° C. or lower, more preferably 800° C. or higher and 1350° C. or lower, further more preferably 950° C. or higher and 1100° C. or lower. The heating time for the epitaxial growth can be appropriately set according to the desired thickness of the SiC grown layer 4.

The pressure in the treatment chamber for the epitaxial growth is not particularly limited, but is preferably $1\times10^{-4}$ Pa or more and atmospheric pressure (100 kPa) or less, more preferably $1\times10^{-3}$ Pa or more and 10 kPa or less.

In this manner, by epitaxially growing the SiC grown layer 4 on the SiC base film 3, the silicon carbide substrate 10 (see FIG. 2) including a high-quality SiC grown layer 4 can be efficiently obtained.

The silicon carbide substrate 10 including such a high-quality SiC grown layer 4 is favorably used as, for example, a semiconductor substrate capable of producing a high-performance power device with high production efficiency.

Hereinabove, the silicon carbide substrate and the method for producing a silicon carbide substrate according to the invention has been described based on the embodiments shown in the drawings, however, the invention is not limited thereto. For example, the silicon carbide substrate and the method for producing a silicon carbide substrate according to the invention may be configured to add an arbitrary step to the above-mentioned embodiments, respectively. The invention can be applied widely without departing from the gist of the invention.

What is claimed is:

1. A method for producing a silicon carbide substrate, comprising:
   forming a silicon carbide base film on one surface side of a silicon substrate to form the silicon carbide substrate; and
   subjecting the silicon carbide substrate to an oxidation treatment, wherein
   an oxide film is formed in a hole between the silicon substrate and the silicon carbide base film.

2. A silicon carbide substrate, comprising:
   a silicon substrate;
   a silicon carbide base film which is stacked on the silicon substrate;
   a through-hole which passes through the silicon carbide base film;
   a hole which is located between the silicon substrate and the silicon carbide base film corresponding to the through-hole; and
   an oxide film is formed in the hole between the silicon substrate and the silicon carbide base film, and
   wherein the silicon carbide substrate is formed by the method according to claim 1.

3. The silicon carbide substrate according to claim 2, wherein the thickness of the silicon carbide base film is 2 nm or more and 100 nm or less.

4. The silicon carbide substrate according to claim 2, wherein the thickness of the oxide film is 3 nm or more and 300 nm or less.

5. The silicon carbide substrate according to claim 2, further comprising a silicon carbide grown layer on the silicon carbide base film.

6. The method for producing a silicon carbide substrate according to claim 1, wherein the oxidation treatment comprises heating the silicon carbide substrate in an oxygen-based gas atmosphere.

7. The method for producing a silicon carbide substrate according to claim 1, further comprising, after the oxidation treatment, an etching treatment using a solution containing hydrofluoric acid.

8. The method for producing a silicon carbide substrate according to claim 1, wherein the forming the silicon carbide base film on the one surface side of the silicon substrate comprises heating the silicon substrate in a carbon-based gas atmosphere.

9. The method for producing a silicon carbide substrate according to claim 1, wherein a temperature of the silicon carbide substrate is maintained at normal temperature or higher when a transition is made from the forming of the silicon substrate to the oxidation treatment.

10. The method for producing a silicon carbide substrate according to claim 7, further comprising epitaxially growing silicon carbide after the etching treatment.

11. The method for producing a silicon carbide substrate according to claim 1, wherein a heating temperature in the oxidation treatment is lower than a heating temperature when forming the silicon carbide base film on the one surface side of the silicon substrate.

* * * * *